(12) United States Patent
Shibuya et al.

(10) Patent No.: US 10,297,391 B2
(45) Date of Patent: May 21, 2019

(54) COMPOSITE ELECTRONIC COMPONENT

(71) Applicant: Murata Manufacturing Co., Ltd., Nagaokakyo-shi, Kyoto-fu (JP)

(72) Inventors: Koki Shibuya, Nagaokakyo (JP); Hirokazu Takashima, Nagaokakyo (JP); Akio Masunari, Nagaokakyo (JP); Tomoyuki Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 321 days.

(21) Appl. No.: 15/390,786

(22) Filed: Dec. 27, 2016

(65) Prior Publication Data

US 2017/0207029 A1 Jul. 20, 2017

(30) Foreign Application Priority Data

Jan. 15, 2016 (JP) ................. 2016-006259

(51) Int. Cl.
*H02H 3/22* (2006.01)
*H01G 4/40* (2006.01)
(Continued)

(52) U.S. Cl.
CPC ........... *H01G 4/40* (2013.01); *H01F 17/0013* (2013.01); *H01F 27/2804* (2013.01);
(Continued)

(58) Field of Classification Search
USPC ...................................................... 361/111
See application file for complete search history.

(56) References Cited

U.S. PATENT DOCUMENTS 5,451,815 A * 9/1995 Taniguchi ......... H01L 23/49811
257/696
5,545,924 A * 8/1996 Contolatis ............... H01L 23/66
257/724

(Continued)

FOREIGN PATENT DOCUMENTS

JP 2001-338838 A 12/2001

*Primary Examiner* — Ronald W Leja
(74) *Attorney, Agent, or Firm* — Keating & Bennett, LLP

(57) ABSTRACT

A composite electronic component includes a substrate with a first main surface and a side end surface, a first electronic component including external electrodes and mounted on the first main surface of the substrate, a second electronic component including external electrodes and being different in electrical function from the first electronic component mounted on the first main surface of the substrate, and a conductive pattern on the first main surface of the substrate, electrically connecting the first electronic component and the second electronic component to each other, and including one end reaching a side of one side end of the substrate, one external electrode of the first electronic component and one external electrode of the second electronic component being located on the side of the one side end of the substrate, another external electrode of the first electronic component and another external electrode of the second electronic component being connected to the conductive pattern, and the composite electronic component being mounted such that a surface of the substrate on the side of the one side end is opposed to a first main surface of a mount substrate.

20 Claims, 4 Drawing Sheets

(51) Int. Cl.
  *H01F 27/28* (2006.01)
  *H01F 27/29* (2006.01)
  *H01G 4/005* (2006.01)
  *H01G 4/248* (2006.01)
  *H01G 4/30* (2006.01)
  *H03H 1/00* (2006.01)
  *H03H 7/01* (2006.01)
  *H05K 1/18* (2006.01)
  *H01F 17/00* (2006.01)
  *H05K 1/03* (2006.01)

(52) U.S. Cl.
  CPC .......... *H01F 27/292* (2013.01); *H01G 4/005* (2013.01); *H01G 4/248* (2013.01); *H01G 4/30* (2013.01); *H03H 1/00* (2013.01); *H03H 1/0007* (2013.01); *H03H 7/0115* (2013.01); *H05K 1/181* (2013.01); *H01F 2017/0026* (2013.01); *H01F 2027/2809* (2013.01); *H03H 2001/0021* (2013.01); *H05K 1/0306* (2013.01); *H05K 1/0313* (2013.01); *H05K 2201/1003* (2013.01); *H05K 2201/10015* (2013.01)

(56) References Cited

U.S. PATENT DOCUMENTS

| | | | | |
|---|---|---|---|---|
| 5,629,839 A * | 5/1997 | Woychik | ............... | H05K 3/366 361/784 |
| 6,124,778 A * | 9/2000 | Rowley | ............... | H01F 17/0013 336/200 |
| 6,246,016 B1 * | 6/2001 | Roessler | ........... | H01L 23/49805 174/261 |
| 6,800,942 B1 * | 10/2004 | Kinsman | ............. | H01L 25/0657 174/255 |
| 6,950,300 B2 * | 9/2005 | Sutardja | ................. | H01G 4/232 361/306.3 |
| 8,344,842 B1 * | 1/2013 | Luzanov | ................ | H05K 1/141 336/192 |
| 9,190,206 B1 * | 11/2015 | Luzanov | ................ | H05K 1/141 |
| 9,198,319 B2 * | 11/2015 | Hsiao | ................... | H05K 7/1432 |
| 2005/0194084 A1 * | 9/2005 | Yoshida | .............. | C04B 35/6269 156/89.11 |
| 2007/0063340 A1 * | 3/2007 | Owyang | ................ | H01L 23/36 257/723 |
| 2009/0296312 A1 * | 12/2009 | Ueda | ...................... | H01C 1/142 361/306.3 |
| 2010/0090781 A1 * | 4/2010 | Yamamoto | ............. | H01L 23/66 333/167 |
| 2013/0245413 A1 * | 9/2013 | Dabney | .................... | A61N 1/08 600/373 |
| 2014/0054795 A1 * | 2/2014 | Romig | .................... | B41M 3/06 257/777 |
| 2014/0066283 A1 * | 3/2014 | Kaneko | ................ | H05K 1/0306 501/9 |
| 2016/0344353 A1 * | 11/2016 | Watts | ...................... | H01L 23/66 |
| 2017/0207029 A1 * | 7/2017 | Shibuya | ............... | H01F 27/2804 |
| 2017/0208691 A1 * | 7/2017 | Masunari | ............... | H01G 4/005 |
| 2017/0309402 A1 * | 10/2017 | Yamashita | ............ | H01C 7/008 |
| 2017/0309679 A1 * | 10/2017 | Kawasaki | ............. | H01L 24/16 |
| 2018/0137982 A1 * | 5/2018 | Sawada | ................. | H01G 4/248 |

\* cited by examiner

US 10,297,391 B2

COMPOSITE ELECTRONIC COMPONENT

CROSS REFERENCE TO RELATED APPLICATIONS

This application claims the benefit of priority to Japanese Patent Application No. 2016-006259 filed on Jan. 15, 2016. The entire contents, of this application are hereby incorporated herein by reference.

BACKGROUND OF THE INVENTION

1. Field of the Invention

The present invention relates to a composite electronic component and particularly to a composite electronic component, for example, provided in or on a portable telephone or a digital camera.

2. Description of the Related Art

Japanese Patent Laying-Open No. 2001-338838 discloses one example of a multi-functional electronic component as a conventional composite electronic component. The multi-functional electronic component disclosed in Japanese Patent Laying-Open No. 2001-338838 is configured such that, in a chip type capacitor in which a conductor electrode for mounting is provided on each of two surfaces opposed to each other, a resistor is provided on a surface of an insulating layer other than a surface where the conductor electrode for mounting is provided and thus a resistor and a capacitor are connected in parallel between the conductor electrodes for mounting.

The multi-functional electronic component disclosed in Japanese Patent Laying-Open No. 2001-338838 was conceived for the purpose of providing a multi-functional electronic component configured such that a plurality of mounted components different in electrical function are implemented as one electronic component.

A conventional composite electronic component such as the multi-functional electronic component disclosed in Japanese Patent Laying-Open No. 2001-338838 has been demanded to allow effective mounting of a plurality of mounted components different in electrical function on a limited mount space, for example, in a portable telephone or a digital camera.

SUMMARY OF THE INVENTION

Preferred embodiments of the present invention provide a composite electronic component which is able to be effectively be mounted on a limited mounting space.

A composite electronic component according to a preferred embodiment of the present invention includes a substrate including a main surface and a side end surface, a first electronic component including a plurality of external electrodes and mounted on a first main surface of the substrate, a second electronic component including a plurality of external electrodes, being different in electrical function from the first electronic component, and mounted on the first main surface of the substrate, and a conductive pattern located on the first main surface of the substrate, electrically connecting the first electronic component and the second electronic component to each other, and including one end reaching a side of one side end of the substrate, one external electrode of the first electronic component and one external electrode of the second electronic component being located on the side of the one side end of the substrate and another external electrode of the first electronic component and another external electrode of the second electronic component being connected to the conductive pattern, and the composite electronic component being mounted such that a surface of the substrate on the side of the one side end is opposed to the first main surface of a mount substrate.

One external electrode of the first electronic component, one external electrode of the second electronic component, and one end of the conductive pattern preferably are located on the side of the one side end of the substrate. Therefore, when the composite electronic component is mounted, for example, on an electronic device such as a portable telephone or a digital camera, the composite electronic component is able to be mounted such that the surface of the substrate on the side of the one side end is opposed to a first main surface of a mother substrate (hereinafter referred to as a "mount substrate") in the electronic device.

Therefore, in the composite electronic component, an area to mount the first electronic component and the second electronic component is able to be smaller than in an example in which the composite electronic component is mounted such that a side of the first main surface of the substrate is opposed to a side of a first main surface of a mount substrate of an electronic device. In the composite electronic component, the surface of the substrate on the side of the one side end of the substrate is preferably smaller in area than the first main surface of the substrate where the first electronic component and the second electronic component are located. Therefore, by mounting the composite electronic component in a standing state such that the one side end surface of the substrate is opposed to the first main surface of the mount substrate, an area to mount the composite electronic component on the first main surface of the mount substrate is able to be made smaller. A space to mount the composite electronic component including an area where one external electrode of the first electronic component, one external electrode of the second electronic component, and one end of the conductive pattern are connected, for example, to a mounting land on the first main surface of the mount substrate is able to be made smaller. Therefore, according to the composite electronic component, effective mounting on a limited mount space is able to be achieved. Mounting this composite electronic component on a mother substrate of an electronic device such as a portable telephone or a digital camera contributes to a reduction in size of the electronic device itself.

A composite electronic component according to a preferred embodiment of the present invention includes a square or substantially square substrate, a first electronic component including two external electrodes and mounted on a first main surface of the substrate, a second electronic component including two external electrodes, being different in electrical function from the first electronic component, and mounted on the first main surface of the substrate, and a conductive pattern located on the first main surface of the substrate, electrically connecting the first electronic component and the second electronic component to each other, and including one end reaching a side of one side end of the substrate, one external electrode of the first electronic component and one external electrode of the second electronic component being located on the side of the one side end of the substrate and the other external electrode of the first electronic component and the other external electrode of the second electronic component being connected to the conductive pattern, and the composite electronic component being mounted such that a surface of the substrate on the side of the one side end is opposed to a first main surface of a mount substrate.

One external electrode of the first electronic component, one external electrode of the second electronic component, and one end of the conductive pattern are preferably located on the side of the one side end of the substrate. Therefore, when the composite electronic component is mounted, for example, on an electronic device such as a portable telephone or a digital camera, the composite electronic component is able to be mounted such that the surface of the substrate on the side of the one side end is opposed to a first main surface of a mother substrate (hereinafter referred to as a "mount substrate") in the electronic device.

Therefore, in the composite electronic component, an area to mount the first electronic component and the second electronic component is able to be smaller than in an example in which the composite electronic component is mounted such that a side of one main surface of the substrate is opposed to a side of a first main surface of a mount substrate of an electronic device.

In the composite electronic component, the surface of the substrate on the side of the one side end of the substrate is preferably smaller in area than the first main surface of the substrate where the first electronic component and the second electronic component are located. Therefore, by mounting the composite electronic component in a standing state such that one side end surface of the substrate is opposed to the first main surface of the mount substrate, an area to mount the composite electronic component on the first main surface of the mount substrate is able to be made smaller. A space to mount the composite electronic component including an area where one external electrode of the first electronic component, one external electrode of the second electronic component, and one end of the conductive pattern are connected, for example, to a mounting land located on the first main surface of the mount substrate is able to be made smaller. Therefore, according to the composite electronic component, effective mounting on a limited mount space is able to be achieved.

An composite electronic component in which the conductive pattern extending to the side of the one side end of the substrate preferably includes an extension portion extending to a surface of the substrate on the side of the one side end of the substrate.

One end side of the conductive pattern is able to be connected to a mounting land located on the first main surface of the mount substrate through the extension portion and an area for connection is thus able to be increased. Therefore, connection reliability at the time when the composite electronic component including the first electronic component and the second electronic component is mounted on the mount substrate is able to be further improved and the reliability of electrical characteristics of the composite electronic component is able to be enhanced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
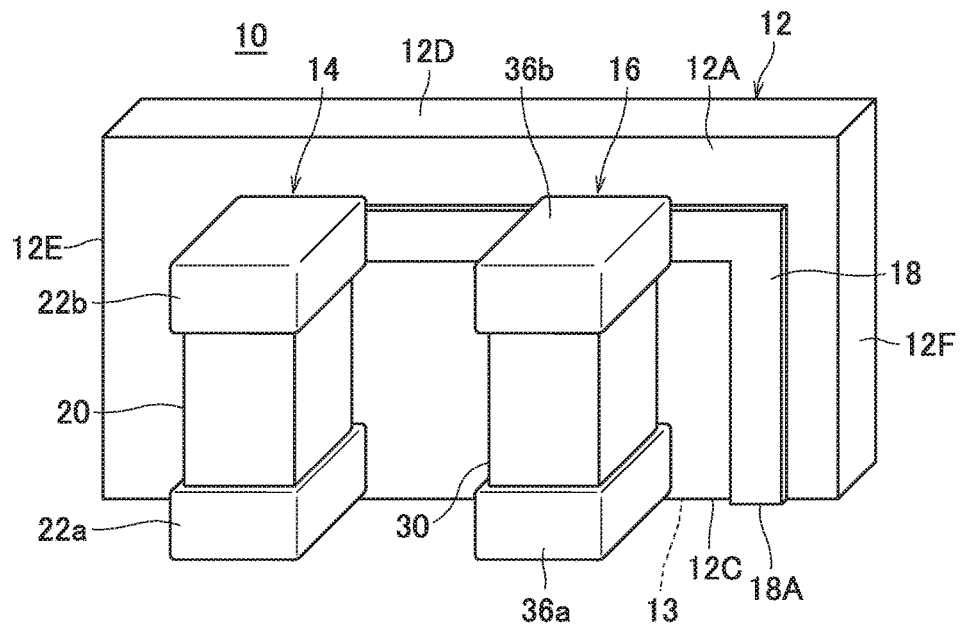
FIG. 1 is a perspective view showing one example, for example, of an LC filter representing one example of a composite electronic component according to a preferred embodiment of the present invention.
Figure 2:
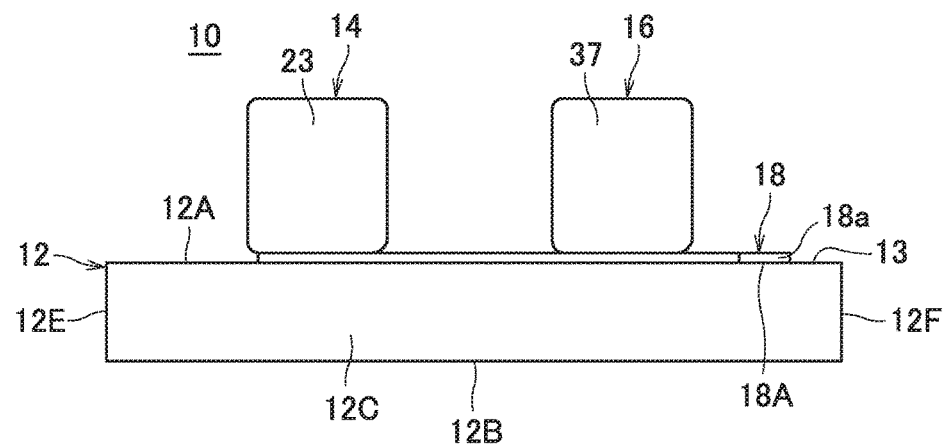
FIG. 2 is a bottom view of the LC filter shown in FIG. 1.

FIG. 1 is a perspective view showing one example, for example, of an LC filter representing one example of a composite electronic component according to a preferred embodiment of the present invention. FIG. 2 is a bottom view of the LC filter shown in FIG. 1.

An LC filter 10 includes a substrate 12, for example, preferably with a rectangular or substantially rectangular shape, for example. The substrate 12 can be, for example, a resin substrate or a ceramic substrate. In this preferred embodiment, the substrate 12 preferably is, for example, an interposer substrate. On one main surface 12A of the substrate 12, for example, a multilayer ceramic inductor 14 representing one example of a first electronic component and for example, a multilayer ceramic capacitor 16 representing one example of a second electronic component are mounted at a distance from each other in a longitudinal direction of the substrate 12.

Figure 7:
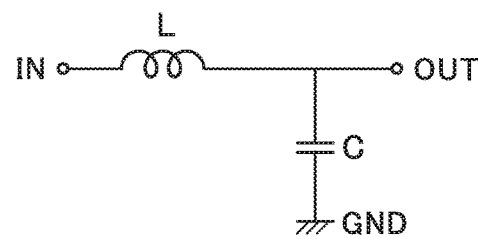
FIG. 7 is an electric equivalent circuit diagram of the LC filter shown in FIG. 1.

In this case, one external electrode 22a of the multilayer ceramic inductor 14 is connected to an input electrode (not shown) located on a mount surface of a mount substrate (not shown) on which the LC filter 10 is mounted. One external electrode 36a of the multilayer ceramic capacitor 16 is connected to a ground electrode (not shown) located on the mount surface of the mount substrate (not shown) on which the LC filter 10 is mounted. The other external electrode 22b of the multilayer ceramic inductor 14 and the other external electrode 36a of the multilayer ceramic capacitor 16 are connected to a conductive pattern 18 located on one main surface of the substrate 12 and the multilayer ceramic inductor 14 and the multilayer ceramic capacitor 16 are electrically connected to each other through a conductive pattern 18. The conductive pattern 18 is structured such that one end 18A thereof reaches a surface 12C of the substrate 12 on a side of one side end, that is, a boundary edge 13 between one end in a direction of width of a bottom surface 12C of the substrate 12 and one end in the direction of width of the one main surface 12A of the substrate 12 as shown in FIGS. 1 and 2. FIG. 7 is an electric equivalent circuit diagram of the LC filter 10 shown in FIG. 1.

Figure 3:
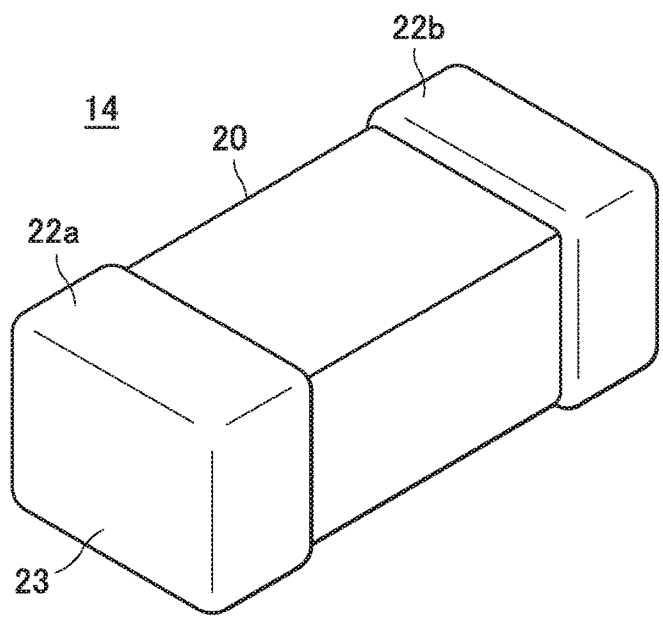
FIG. 3 is a perspective view showing one example, for example, of a multilayer ceramic inductor representing one example of a first electronic component included in the composite electronic component shown in FIGS. 1 and 2.
Figure 4:
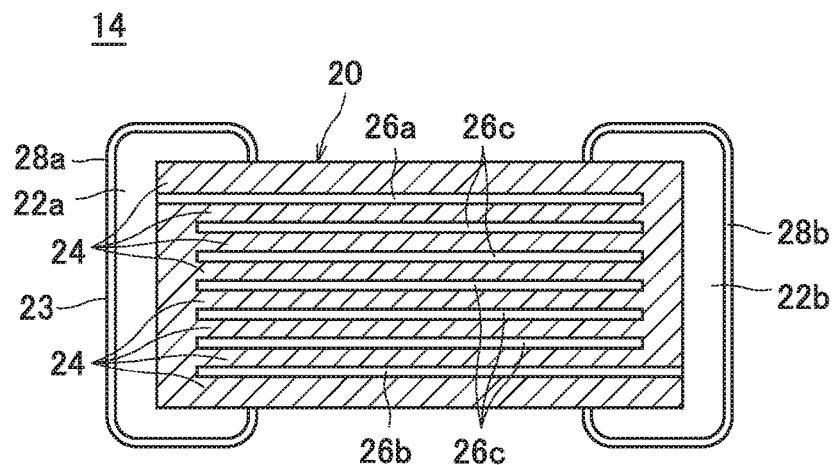
FIG. 4 is an exploded cross-sectional view showing an internal structure of the multilayer ceramic inductor shown in FIG. 3.

FIG. 3 is a perspective view showing one example, for example, of the multilayer ceramic inductor representing one example of the first electronic component included in the composite electronic component shown in FIGS. 1 and 2. FIG. 4 is an exploded cross-sectional view showing an internal structure of the multilayer ceramic inductor shown in FIG. 3.

As shown in FIG. 3, the multilayer ceramic inductor 14 includes a ceramic element 20 with a parallelepiped or substantially parallelepiped shape and external electrodes 22a and 22b on respective left and right end portions of the ceramic element 20. As shown in FIG. 4, the ceramic element 20 preferably is a multilayer body including a plurality of ceramic layers 24 and a plurality of internal electrodes 26a, 26b, and 26c layered in a direction of thickness.

The plurality of the ceramic layers 24 are each preferably made of a magnetic ceramic material such as Cu—Zn based ferrite or Ni—Zn based ferrite.

The internal electrode 26a is two-dimensional, for example, preferably with a J shape (not shown), and includes an end portion extending to a left end surface of the ceramic element 20 and electrically connected to the external electrode 22a. The internal electrode 26b is two-dimensional, for example, preferably with a J shape (not shown), and includes an end portion extending to a right end surface of the ceramic element 20 and electrically connected to the external electrode 22b. A plurality of internal electrodes 26c are two-dimensional, for example, preferably with a C shape between the ceramic layers 24 between the internal electrodes 26a and 26b. The internal electrode 26a, the plurality of internal electrodes 26c, and the internal electrode 26b are connected in series to define a coil by through hole electrodes (not shown) which pass through the ceramic layers 24. A coil function is exhibited between the external electrodes 22a and 22b. The internal electrodes 26a, 26b, and 26c and the through hole electrodes are preferably composed of Ag, Cu, Ni, Pd, or an alloy of these metals, for example.

The external electrodes 22a and 22b include plating coatings 28a and 28b provided on their respective surfaces. The plating coatings 28a and 28b protect the external electrodes 22a and 22b and improve solderability of the external electrodes 22a and 22b.

Figure 5:
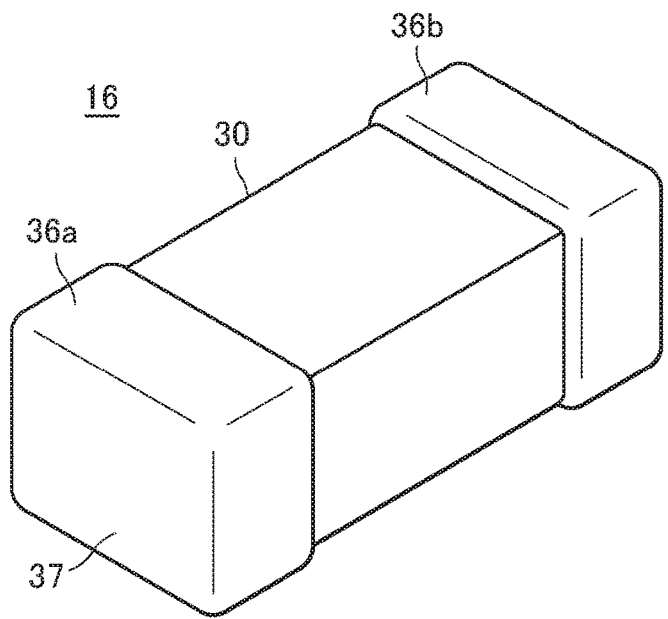
FIG. 5 is a perspective view showing one example, for example, of a multilayer ceramic capacitor representing one example of a second electronic component included in the composite electronic component shown in FIGS. 1 and 2.
Figure 6:
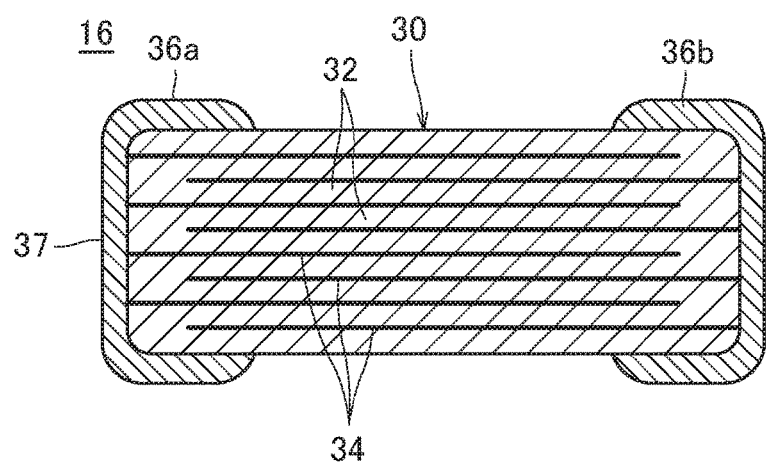
FIG. 6 is an exploded cross-sectional view showing an internal structure of the multilayer ceramic capacitor shown in FIG. 5.

FIG. 5 is a perspective view showing one example, for example, of the multilayer ceramic capacitor representing one example of the second electronic component included in the composite electronic component shown in FIGS. 1 and 2. FIG. 6 is an exploded cross-sectional view showing an internal structure of the multilayer ceramic capacitor shown in FIG. 5.

The multilayer ceramic capacitor 16 includes a ceramic element 30 preferably with a parallelepiped or a substantially parallelepiped shape. The ceramic element 30 includes a first main surface and a second main surface opposed to each other and a first side surface and a second side surface opposed to each other along a longitudinal direction and has a first end surface and a second end surface opposed to each other at opposing ends in the longitudinal direction. A corner portion and a ridgeline portion of the ceramic element 30 are preferably rounded.

The ceramic element 30 is formed preferably by alternately stacking a plurality of ceramic layers 32 and a plurality of internal electrodes 34. The internal electrodes 34 include a main surface opposed to the first main surface and the second main surface of the ceramic element 30 and provided in the ceramic element 30 such that the main surfaces of adjacent pairs of the internal electrodes 34 are opposed to each other. The internal electrodes 34 alternately extend to the first end surface and the second end surface of the ceramic element 30.

A dielectric ceramic material mainly composed, for example, of $BaTiO_3$, $CaTiO_3$, $SrTiO_3$, or $CaZrO_3$ may be used as a ceramic material of the ceramic layer 32. A material in which a sub component such as an Mn compound, an Fe compound, a Cr compound, a Co compound, or an Ni compound is added to such a main component may also be used.

In addition, depending on a type of an electronic component, piezoelectric ceramics such as PZT based ceramics, semiconductor ceramics such as spinel type ceramics, or magnetic ceramics such as ferrite can be used. For example, Cu, Ni, Ag, Pd, an Ag—Pd alloy, or Au can be used as a material of the internal electrode 34.

The external electrodes 36a and 36b are provided on the first end surface and the second end surface of the ceramic element 30, respectively, and connected to respective ones of the internal electrodes 34. The external electrodes 36a and 36b extend from the first end surface and the second end surface of the ceramic element 30, respectively, to wrap around two main surfaces and two side surfaces. The external electrodes 36a and 36b each preferably include an underlying layer and a plating layer. For example, Cu, Ni, Ag, Pd, an Ag—Pd alloy, or Au can be used for a material for the underlying layer. The underlying layer can be formed through cofiring for formation of an underlying layer of the external electrodes 36a and 36b, simultaneously with formation of the ceramic element 30 including the internal electrodes 34 by applying a conductive paste to an end surface of a yet-to-be-fired ceramic element 30 and then firing the conductive paste. The underlying layer for the external electrodes 36a and 36b can be formed also by post-firing in which a conductive paste is applied to an end surface of a fired ceramic element 30 and baking the conductive paste.

A plating layer (not shown) is preferably formed on the underlying layer. For example, Cu, Ni, Ag, Pd, an Ag—Pd alloy, or Au can be used for a material for the plating layer. The plating layer may include a plurality of layers, and it preferably includes a two-layered structure of an Ni plating layer and an Sn plating layer. A conductive resin layer that reduces stress may further be provided between the underlying layer and the plating layer. As a result of the external electrodes 36a and 36b being connected to alternate ones of the internal electrodes 34, a capacitance is provided between the external electrodes 36a and 36b.

In the LC filter 10 shown in FIGS. 1 and 2, the multilayer ceramic inductor 14 and the multilayer ceramic capacitor 16 are mounted on the one main surface 12A of the substrate 12. In the LC filter 10 on which the multilayer ceramic inductor 14 and the multilayer ceramic capacitor 16 are mounted, a side of the bottom surface 12C of the substrate 12, that is, a side of the side end surface 12C located on a side of the one end in the direction of width of the one main surface 12A of the substrate 12, defines a side of a mount surface to mount the LC filter 10 on a mount substrate (not shown). In this case, since the bottom surface (the one side end surface) 12C of the substrate 12 is smaller in area than the one main surface 12A of the substrate 12, the LC filter 10 is able to be smaller in mount space than that of an example in which a side of the other main surface 12B of the substrate 12 is mounted on a mount surface (not shown) of the mount substrate.

In the LC filter 10 according to a preferred embodiment of the present invention, in particular, one external electrode 22a of the multilayer ceramic inductor 14, one external electrode 36a of the multilayer ceramic capacitor 16, and one end 18A of the conductive pattern 18 are arranged on the side of the one side end of the substrate 12 as shown in FIGS. 1 and 2. In this case, the external electrode 22a, the external electrode 36a, and the one end 18A of the conductive pattern 18 are arranged on the side of the surface 12C of the substrate 12 on the side of the one side end, that is, on the side of the boundary edge 13 between the one end in the direction of the width of the bottom surface 12C of the substrate 12 and the one end in the direction of the width of the one main surface 12A of the substrate 12 in FIG. 1.

Therefore, when the LC filter 10 is mounted on an electronic device (not shown) such as a portable telephone or a digital camera, the LC filter is able to be mounted such that the surface (i.e., a bottom surface) 12C of the substrate 12 on the side of the one side end is opposed to the one main surface of a mother substrate (referred to as a "mount substrate" in the description below) in the electronic device.

In the LC filter 10, an area to mount the multilayer ceramic inductor 14 and the multilayer ceramic capacitor 16 is able to be made smaller than in an example where the LC filter is mounted such that a side of the one main surface 12A of the substrate 12 is opposed to the side of the one main surface of a mount substrate of the electronic device.

In the LC filter 10, the surface (what is called the one side end surface of the substrate 12) of the substrate 12 on the side of the one side end is preferably smaller in area than the one main surface 12A of the substrate 12 on which the multilayer ceramic inductor 14 and the multilayer ceramic capacitor 16 are mounted. Therefore, by mounting the LC filter in a standing state such that the one side end surface 12C of the substrate 12 is opposed to the one main surface of the mount substrate, an area to mount the LC filter 10 on the one main surface of the mount substrate is able to be made smaller.

Figure 8:
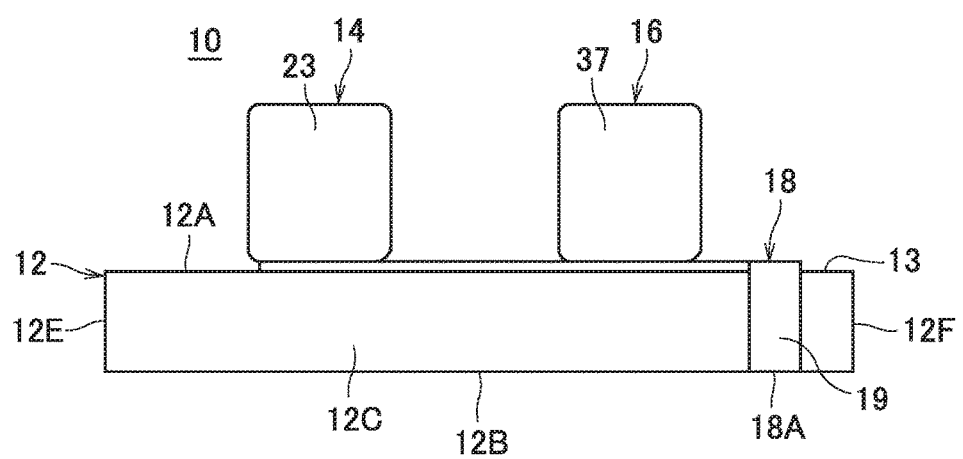
FIG. 8 is a bottom view showing a modification of the LC filter shown in FIG. 1.

In the LC filter 10, as shown in FIGS. 1 and 8, the LC filter is mounted in a standing state on the one main surface of the mount substrate such that the one side end surface in the direction of the width of the substrate 12 is defined as the bottom surface 12C. Therefore, a height is able to be smaller than in a mount example where the substrate 12 stands on the one main surface of the mount substrate, for example, such that the one side end surface 12E in a direction of length of the substrate 12 or the other side end surface 12F in the direction of length of the substrate 12 is defined as the bottom surface.

Therefore, a space to mount the LC filter 10 including an area for connection of the one external electrode 22a of the multilayer ceramic inductor 14, the one external electrode 36a of the multilayer ceramic capacitor 16, and the one end 18A of the conductive pattern 18, for example, to a mounting land located on the one main surface of a mount substrate is able to be made smaller. In the LC filter 10, as shown in FIG. 2, a space to mount the LC filter 10 including an area of a connection surface 23 of the external electrode 22a, a connection surface 37 of the external electrode 36a, and a connection surface 18a of the one end 18A of the conductive pattern 18 connected to a land on a side of the mount substrate is able to be made smaller.

Therefore, the LC filter 10 is able to be effectively mounted on a limited mount space.

FIG. 8 is a bottom view showing a modification of the LC filter shown in FIG. 1. In the LC filter 10 shown in FIG. 8, the one end 18A of the conductive pattern 18 preferably is located on the one side in the longitudinal direction of the one main surface 12A of the substrate 12 at the one end in the direction of width of the substrate 12. On the other hand, in the LC filter 10 shown in FIG. 8, particularly, the conductive pattern 18 preferably extends to a side of the bottom surface 12C of the substrate 12 (a side of the one side end surface of the substrate 12) to define an extension portion 19. The extension portion 19 extends from one end in the direction of width of the bottom surface 12C of a base material 12 (one side end surface of the substrate 12) to the other end.

When the LC filter 10 is mounted on a mount surface of a mount substrate (not shown), the entire surface of the extension portion 19 of the conductive pattern 18 is able to be connected to a land surface (not shown) located on the mount surface. Therefore, an area for connection between the land surface of the mount surface and the extension portion 19 is able to be increased and reliability in connection of the LC filter 10 to the mount substrate (not shown) is able to be enhanced. In the modification shown in FIG. 8, the side of the one end 18A of the conductive pattern 18 is able to be connected to the mounting land located on the one main surface of the mount substrate with the extension portion 19 being interposed, and an area for connection with the mounting land is able to be increased.

Therefore, reliability in connection at the time when the LC filter 10 including the multilayer ceramic inductor 14 and the multilayer ceramic capacitor 16 is mounted on a mount substrate is able to be further improved and reliability of electrical characteristics of the LC filter 10 is able to be enhanced.

In the preferred embodiments according to the present invention described above, for example, the LC filter 10 including the multilayer ceramic inductor 14 as the first electronic component and the multilayer ceramic capacitor 16 as the second electronic component has been described by way of example of a composite electronic component. The present invention, however, is not limited to the LC filter 10 but can be applied as appropriate, for example, also to a composite electronic component including at least two of an inductor, a capacitor, a resistor, and a semiconductor.

A substrate with any two-dimensional shape such as a rectangle, a square, a circle, and an oval in a plan view is able to be adopted as appropriate for the substrate 12. Though the first electronic component and the second electronic component preferably have a parallelepiped or substantially parallelepiped shape in the preferred embodiments described above, for example, limitation thereto is not intended but an electronic component in any shape such as a cube, a cylinder, or a disc can be adopted as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component comprising:
    a substrate including a main surface;
    a first electronic component including a plurality of external electrodes and mounted on the main surface of the substrate;
    a second electronic component including a plurality of external electrodes, being different in electrical function from the first electronic component, and mounted on the main surface of the substrate; and
    a conductive pattern located on the main surface of the substrate, electrically connecting the first electronic component and the second electronic component to each other, and including one end extending to a side of one side end of the substrate; wherein
    one of the plurality of external electrodes of the first electronic component and one of the plurality of external electrodes of the second electronic component are located on the side of the one side end of the substrate;

another of the plurality of external electrodes of the first electronic component and another of the plurality of external electrodes of the second electronic component are connected to the conductive pattern; and the composite electronic component is mounted such that a surface of the substrate on the side of the one side end is opposed to a main surface of a mount substrate.

2. The composite electronic component according to claim 1, wherein the conductive pattern extending to the side of the one side end of the substrate includes an extension portion extending to a surface of the substrate on the side of the one side end of the substrate.

3. The composite electronic component according to claim 1, wherein the composite electronic component is an LC filter.

4. The composite electronic component according to claim 1, wherein the substrate is rectangular or substantially rectangular.

5. The composite electronic component according to claim 1, wherein the substrate is made of resin or ceramic.

6. The composite electronic component according to claim 1, wherein the substrate is an interposer substrate.

7. The composite electronic component according to claim 1, wherein the first electronic component is an inductor and the second electronic component is a capacitor.

8. The composite electronic component according to claim 7, wherein the inductor is a multilayer inductor and the capacitor is a multilayer capacitor.

9. The composite electronic component according to claim 1, wherein the first electronic component and the second electronic component each include external electrodes including an underlying layer and a plating layer.

10. A communication apparatus comprising the composite electronic component according to claim 1, wherein the communication apparatus is one of a telephone and a camera.

11. A composite electronic component comprising:
a substrate;
a first electronic component including two external electrodes and mounted on a main surface of the substrate;
a second electronic component including two external electrodes, being different in electrical function from the first electronic component, and mounted on the main surface of the substrate; and
a conductive pattern located on the main surface of the substrate, electrically connecting the first electronic component and the second electronic component to each other, and including one end that extends to a side of one side end of the substrate; wherein one of the two external electrodes of the first electronic component and one of the two external electrodes of the second electronic component are located on the side of the one side end of the substrate;

the other of the two external electrodes of the first electronic component and the other of the two external electrodes of the second electronic component are connected to the conductive pattern; and the composite electronic component is mounted such that a surface of the substrate on the side of the one side end is opposed to a main surface of a mount substrate.

12. The composite electronic component according to claim 11, wherein the conductive pattern extending to the side of the one side end of the substrate includes an extension portion extending to a surface of the substrate on the side of the one side end of the substrate.

13. The composite electronic component according to claim 11, wherein the composite electronic component is an LC filter.

14. The composite electronic component according to claim 11, wherein the substrate is square or substantially square.

15. The composite electronic component according to claim 11, wherein the substrate is made of resin or ceramic.

16. The composite electronic component according to claim 11, wherein the substrate is an interposer substrate.

17. The composite electronic component according to claim 11, wherein the first electronic component is an inductor and the second electronic component is a capacitor.

18. The composite electronic component according to claim 17, wherein the inductor is a multilayer inductor and the capacitor is a multilayer capacitor.

19. The composite electronic component according to claim 11, wherein the first electronic component and the second electronic component each include external electrodes including an underlying layer and a plating layer.

20. A communication apparatus comprising the composite electronic component according to claim 11, wherein the communication apparatus is one of a telephone and a camera.

* * * * *